United States Patent
Lee et al.

(10) Patent No.: US 9,667,241 B2
(45) Date of Patent: May 30, 2017

(54) LEAKAGE CURRENT-BASED DELAY CIRCUIT

(71) Applicants: Samsung Electronics Co., Ltd., Suwon-si (KR); Postech Academy-Industry Foundation, Pohang-si (KR)

(72) Inventors: Jaesup Lee, Yongin-si (KR); Tae-Young Chung, Pohang-si (KR); Bum-Man Kim, Pohang-si (KR); Dae-Chul Jeong, Pohang-si (KR)

(73) Assignees: Samsung Electronics Co., Ltd., Suwon-si (KR); Poshtech Academy-Industry Foundation, Pohang-si (KR)

( * ) Notice: Subject to any disclaimer, the term of this patent is extended or adjusted under 35 U.S.C. 154(b) by 0 days.

(21) Appl. No.: 14/863,935

(22) Filed: Sep. 24, 2015

(65) Prior Publication Data

US 2016/0241229 A1    Aug. 18, 2016

(30) Foreign Application Priority Data

Feb. 16, 2015 (KR) .................. 10-2015-0023254

(51) Int. Cl.
*H03K 5/131* (2014.01)
*H03K 17/284* (2006.01)
(Continued)

(52) U.S. Cl.
CPC .......... *H03K 17/292* (2013.01); *H03K 5/131* (2013.01); *H03K 17/284* (2013.01); *H03K 2005/00019* (2013.01); *H03K 2005/00195* (2013.01)

(58) Field of Classification Search
CPC .......... H03K 5/13; H03K 5/131; H03K 5/133; H03K 5/134; H03K 5/14; H03K 2005/00013; H03K 2005/00019; H03K 2005/00058; H03K 2005/00065; H03K 2005/00071; H03K 2005/0015; H03K 2005/00195; H03K 2005/00215; H03K 2005/00221; H03K 2005/00228;
(Continued)

(56) References Cited

U.S. PATENT DOCUMENTS 4,001,610 A    1/1977  Griffin
4,301,500 A    11/1981 Seki et al.
(Continued)

FOREIGN PATENT DOCUMENTS

JP    2005-217860 A    8/2005

*Primary Examiner* — William Hernandez
(74) *Attorney, Agent, or Firm* — NSIP Law

(57) ABSTRACT

A leakage current-based delay circuit is provided, wherein the delay circuit may include a first transistor circuit and a second transistor circuit, each transistor circuit may include a p-type transistor, an n-type transistor, an n-node between a drain node of the p-type transistor and a gate node of the n-type transistor, and a p-node between a gate node of the p-type transistor and a drain node of the n-type transistor. The p-node of the second transistor circuit may be charged based on a power source voltage through the first transistor circuit during a first time interval of an input signal, and the n-node of the second transistor circuit may be discharged based on a ground voltage through the first transistor circuit during the first time interval.

23 Claims, 8 Drawing Sheets

(51) Int. Cl.
*H03K 17/292* (2006.01)
*H03K 5/00* (2006.01)

(58) Field of Classification Search
CPC .......... H03K 2005/00234; H03K 2005/00293; H03K 17/28; H03K 17/284; H03K 17/292
USPC ....... 327/261, 263, 264, 276, 277, 278, 281, 327/284, 285, 288
See application file for complete search history.

(56) References Cited

U.S. PATENT DOCUMENTS

| | | | |
|---|---|---|---|
| 4,315,274 A | | 2/1982 | Fukui et al. |
| 4,792,838 A | | 12/1988 | Hayashi et al. |
| 4,821,083 A | | 4/1989 | Ogura et al. |
| 4,876,468 A | | 10/1989 | Libert |
| 4,943,745 A | * | 7/1990 | Watanabe ............ G11C 19/184 327/262 |
| 5,194,764 A | * | 3/1993 | Yano .................... G11C 7/1051 326/27 |
| 5,801,567 A | | 9/1998 | Kosiec |
| 7,352,233 B1 | | 4/2008 | Mueller et al. |
| 8,605,408 B2 | | 12/2013 | Godo et al. |
| 2003/0189452 A1 | * | 10/2003 | Honda .................. H03K 5/133 327/276 |

* cited by examiner

LEAKAGE CURRENT-BASED DELAY CIRCUIT

CROSS-REFERENCE TO RELATED APPLICATION(S)

This application claims the benefit under 35 USC 119(a) of Korean Patent Application No. 10-2015-0023254, filed on Feb. 16, 2015, in the Korean Intellectual Property Office, the entire disclosure of which is incorporated herein by reference for all purposes.

BACKGROUND

1. Field

The following description relates to a leakage current-based delay circuit and method, and an electronic device that includes such a leakage current-based delay circuit.

2. Description of Related Art

As only examples, a delay circuit may be a circuit element used to assign a predetermined delay time to an input signal. For example, such a circuit element may be used in a self-timed asynchronous method system. As another example, when such a circuit element is included in a sensor network or a body area network there may be a desire for operation at a low power. In a delay circuit, adjusting a delay time may be significant. In general, a method of adjusting the delay time based on a resistance value and a capacitor value may be used. Such an approach is structurally limited to the low power operation.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

One or more embodiments provide a delay circuit, including a first transistor circuit configured to generate a first signal, as a delayed signal of an input signal, during a first time interval of the input signal, and a second transistor circuit connected to the first transistor circuit and configured to generate a second signal, as the delayed signal of the input signal, during a second time interval of the input signal, wherein the first transistor circuit and the second transistor circuit are controlled to alternately operate to respectively generate the first signal and the second signal based on respective occurrences of the first and second time intervals of the input signal.

The occurrence of the first time interval may be initiated by or include a rising edge of the input signal, and the occurrence of the second time interval may be initiated by or include a falling edge of the input signal.

The first transistor circuit may include a first switch circuit configured to operate the first transistor circuit, based on the input signal, during the first time interval, and the second transistor circuit may include a second switch circuit configured to operate the second transistor circuit, based on a reverse signal of the input signal, during the second time interval.

The first transistor circuit may include the first switch circuit configured to not operate the first transistor circuit during the second time interval, and the second transistor circuit may include the second switch circuit configured to not operate the second transistor circuit during the first time interval.

The first transistor circuit may include a first p-type transistor, a first n-type transistor, a first n-node between a drain node of the first p-type transistor and a gate node of the first n-type transistor, and a first p-node between a gate node of the first p-type transistor and a drain node of the first n-type transistor.

The first n-node may be charged based on a power source voltage through a leakage current of the first p-type transistor during the first time interval, and the first p-node may be discharged based on a ground voltage through a leakage current of the first n-type transistor during the first time interval.

The second transistor circuit may include a second p-node configured to be charged based on a power source voltage through the first n-node of the first transistor circuit during the first time interval, and a second n-node configured to be discharged based on a ground voltage through the first p-node of the first transistor circuit during the first time interval.

The delay circuit may further include a capacitor connected between the first transistor circuit and the second transistor circuit, where a delay time of the delayed signal of the input signal may be adjusted based on a controlled adjusting of a capacitance of the capacitor.

The first transistor circuit may include a first variable transistor configured to have a size that is selectively adjusted based on a delay control signal, so that a leakage current of the first transistor circuit is adjusted based on the selectively adjusted size of the first variable transistor.

The first transistor circuit may include a parallel transistor circuit configured to have a number of transistors connected in parallel to be selectively adjusted based on a delay control signal, so that a leakage current of the first transistor circuit is adjusted based on the selectively adjusted number of transistors connected in parallel.

A leakage current of the first transistor circuit may be adjusted based on selectively controlled body voltage of the first transistor circuit.

A leakage current of the first transistor circuit may be adjusted based on a parasitic capacitance of the first transistor circuit.

The delay circuit may further include a first inverter connected to the second transistor circuit to invert the delayed signal of the input signal, and a second inverter connected to the first inverter, to output a corrected delayed signal of the input signal, from an output of the first inverter, so as to reduce smoothing caused by leakage currents.

One or more embodiments include an electronic device including a delay circuit having a first transistor circuit configured to generate a first signal, as a delayed signal of an input signal, during a first time interval of the input signal, and a second transistor circuit connected to the first transistor circuit and configured to generate a second signal, as the delayed signal of the input signal, during a second time interval of the input signal, and a signal generator configured to selectively operate, based on the input signal, the first transistor circuit during the first time interval and the second transistor circuit during the second time interval.

The signal generator may be configured to operate the second transistor circuit, during the second time interval, based on a reverse signal of the input signal.

The signal generator may be configured to adjust a delay time of the delayed signal of the input signal by selectively adjusting respective leakage currents of the first transistor circuit and the second transistor circuit based on a delay control signal.

The delay circuit may include a variable capacitor connected between the first transistor circuit and the second transistor circuit, and the signal generator may be configured to adjust a delay time of the delayed signal of the input signal by selectively adjusting a capacitance of the variable capacitor based on a delay control signal.

The signal generator may be configured to adjust a delay time of the delayed signal of the input signal by adjusting, based on a delay control signal, one of a first parasitic capacitance of the first transistor circuit and a second parasitic capacitance of the second transistor circuit.

The first transistor circuit may include a first variable transistor configured to have a size that is selectively adjusted, and the signal generator may be configured to adjust a delay time of the delayed signal of the input signal by selectively adjusting the size of the first variable transistor based on a delay control signal.

The first transistor circuit may include a first parallel transistor circuit configured to have a number of transistors connected in parallel that is selectively adjusted based on a delay control signal, and the signal generator may be configured to selectively adjust a delay time of the delayed signal of the input signal by adjusting the number of transistors connected in parallel based on the delay control signal.

One or more embodiments include a delay circuit operation method, including generating a first signal, as a delayed signal of an input signal, during a first time interval of the input signal, generating a second signal, as the delay signal of the input signal, during a second time interval of the input signal based on the input signal, and controlling an adjustment of a delay of the delayed signal of the input signal based on an input delay control signal.

One or more embodiments include an electronic device, including a first transistor circuit configured to selectively generate a first signal from an input signal during a first time interval of the input signal, and a second transistor circuit connected to the first transistor circuit and configured to output the first signal, as a delay of the input signal, during the first time interval and while the second transistor circuit is controlled to not operate, and configured to output a second signal, as the delay of the input signal, during a second time interval of the input signal and while the second transistor circuit is controlled to operate.

The first and second transistor circuits may be configured so that a delay difference, between the input signal and a combination of the output first signal and output second signal, is adjustable based upon an input delay control signal.

Other features and aspects will be apparent from the following detailed description, the drawings, and the claims.

Figure 1:
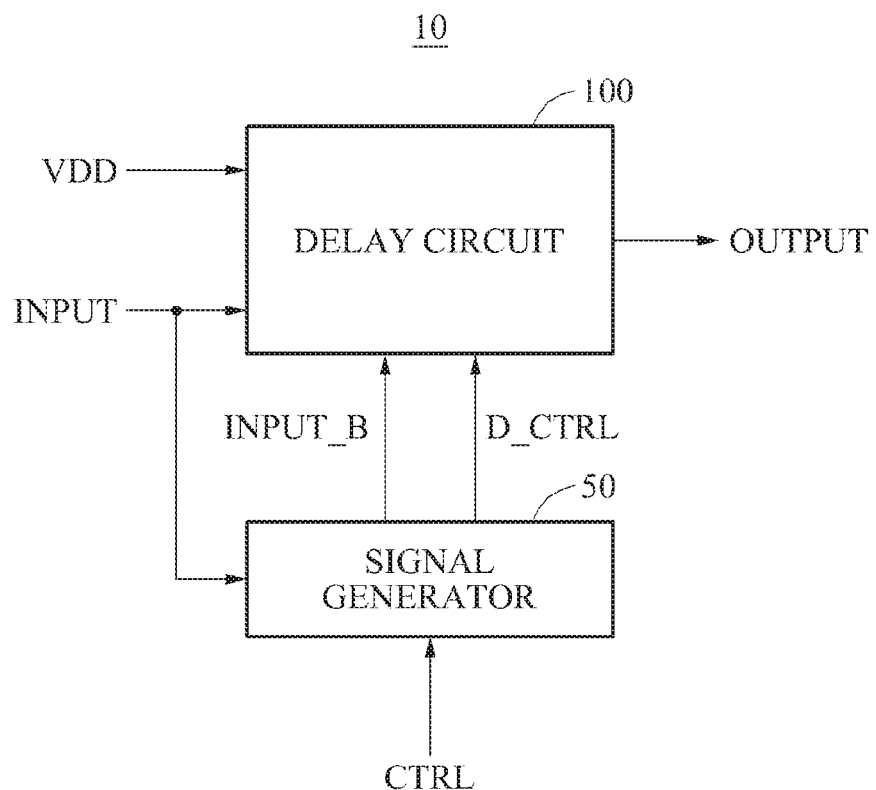
FIG. 1 is a diagram illustrating an example of an electronic device including a delay circuit, according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the exemplary embodiments, some of which will be illustrated in detail in the drawings and detailed description. However, it should be understood that these embodiments are not construed as limited to the illustrated forms and include all changes, equivalents, or alternatives within the idea and the technical scope of this disclosure.

Terms used herein are to merely explain specific embodiments, thus it is not meant to be limiting. A singular expression includes a plural expression except when two expressions are contextually different from each other. For example, as used herein, the singular forms "a," "an" and "the" are intended to include the plural forms as well, unless the context clearly indicates otherwise. Herein, a term "include" or "have" are also intended to indicate that characteristics, figures, operations, components, or elements disclosed on the specification or combinations thereof exist. The term "include" or "have" should be understood so as not to pre-exclude existence of one or more other characteristics, figures, operations, components, elements or combinations thereof or additional possibility.

Unless otherwise defined, all terms including technical and scientific terms used herein have the same meaning as commonly understood by one of ordinary skill in the art to which this invention belongs, in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, certain embodiments will be explained in more detail with reference to the attached drawings, wherein like reference numerals refer to like elements throughout. Like component or components corresponding to each other will be provided with the same reference numeral, and their detailed explanation will be omitted. When it is determined that a detailed description of a related or known function or configuration may make a purpose of an embodiment of the present disclosure unnecessarily ambiguous, such a detailed description may be omitted.

Herein below, it has been found below that a delay circuit may be operable in a low power system, for example, by adjusting the delay time through control of leakage current.

FIG. 1 is a diagram illustrating an example of an electronic device including a delay circuit, according to one or more embodiments.

Referring to FIG. 1, an electronic device 10 may include a delay circuit 100 and a signal generator 50, for example.

The delay circuit 100 may generate an output signal OUTPUT based on an input signal INPUT, a power source voltage VDD, and a delay control signal D_CTRL. As only non-limiting examples, the delay circuit 100 may be used for a controller of an ultra-low power (ULP) sensor module, for example, a wireless sensor network (WSN) and a wireless body area network (WBAN), or a phase-locked loop (PLL), a delay-looked loop (DLL), a DC to DC converter, an oscillator, and a pulse generator, noting that additional and/or alternative implementations are also available.

The input signal INPUT may be divided into a first time interval and a second time interval respectively representing different features of the input signal INPUT. For example, the input signal INPUT may have a rising edge feature and a falling edge feature. An occurrence of the first time interval may be initiated by or include a rising edge of the input signal INPUT and an occurrence of the second time interval may be initiated by or include a falling edge of the input signal INPUT. Similarly, for example, an end point of the first time interval may occur at the falling edge of the input signal INPUT, and an end point of the second time interval may occur at a rising edge of the input signal INPUT. An operation of the delay signal 100 during the first time interval and an operation of the delay signal 100 during the second time interval may be different.

The power source voltage VDD may be referred to as a power supplied to a transistor circuit included in the delay circuit 100. The power source voltage VDD may be determined based on an internal voltage of the electronic device 10 or a system voltage including the electronic device 10, for example.

The delay control signal D_CTRL is a signal for adjusting a delay time of the output signal OUTPUT. The delay control signal D_CTRL may be generated by the signal generator 50, for example.

The output signal OUTPUT may thus be the delayed signal of the input signal INPUT. The delay time of the output signal OUTPUT may be adjusted based on various factors. The delay time may be adjusted through a control of a transistor circuit included in the delay circuit 100. For example, a delay time may be adjusted based on selective adjusting of any, or any combination, of a capacitance, a size, and a body voltage of a transistor circuit of the delay circuit 100.

The capacitance, the size, and the body voltage of the transistor circuit of the delay circuit 100 may influence an amount of a leakage current of the transistor circuit of the delay circuit 100, and the delay time may be adjusted based on the amount of the leakage current. The capacitance, the size, and the body voltage of a transistor circuit may, accordingly, be adjusted based on the delay control signal D_CTRL.

The signal generator 50 may generate a reverse input signal INPUT_B based on the input signal INPUT. The delay circuit 100 may include a first transistor circuit and a second transistor circuit that are interconnected and alternately operated. The signal generator 50 may operate the first transistor circuit included in the delay circuit 100, based on the input signal INPUT, during the first time interval of the input signal INPUT, and may also operate the second transistor circuit included in the delay circuit 100, based on the reverse input signal INPUT_B of the input signal INPUT, during the second time interval of the input signal INPUT. The signal generator 50 may include an inverter, for example, to generate the reverse input signal INPUT_B.

The signal generator 50 may generate the delay control signal D_CTRL based on a control signal CTRL. The control signal CTRL may be received from a synchronizing apparatus for synchronizing internal signals of the electronic device 10 or system including the electronic device 10. The signal generator 50 may adjust the delay time of the output signal OUTPUT based on the delay control signal D_CTRL, which is based on the control signal CTRL.

The signal generator 50 may adjust the capacitance, the size, and the body voltage of the transistor circuit of the delay circuit 100 through the delay control signal D_CTRL. For example, the signal generator 50 may adjust the delay time of the output signal OUTPUT by adjusting the leakage current of the transistor circuit of the delay circuit 100 based on the delay control signal D_CTRL. The signal generator 50 may adjust the delay time of the output signal OUTPUT by adjusting a capacitance of the capacitor connected among transistor circuits of the delay circuit 100 based on the delay control signal D_CTRL. The signal generator 50 may adjust the delay time of the output signal OUTPUT by adjusting a parasitic capacitance of the transistor circuit of the delay circuit 100 based on the delay control signal D_CTRL. The signal generator 50 may adjust the delay time of the output signal OUTPUT by adjusting a size of a transistor included in the delay circuit 100 based on the delay control signal D_CTRL. The signal generator 50 may adjust the delay time of the output signal OUTPUT by adjusting a number of transistors connected in parallel in the delay circuit 100 based on the delay control signal D_CTRL. A principle of adjusting the delay time of the output signal OUTPUT, based on factors described in the preceding, will be discussed in greater detail below.

Hereinafter, example configurations and operations of the delay circuit 100 and the signal generator 50 will be described with reference to the accompanying drawings.

Figure 2:
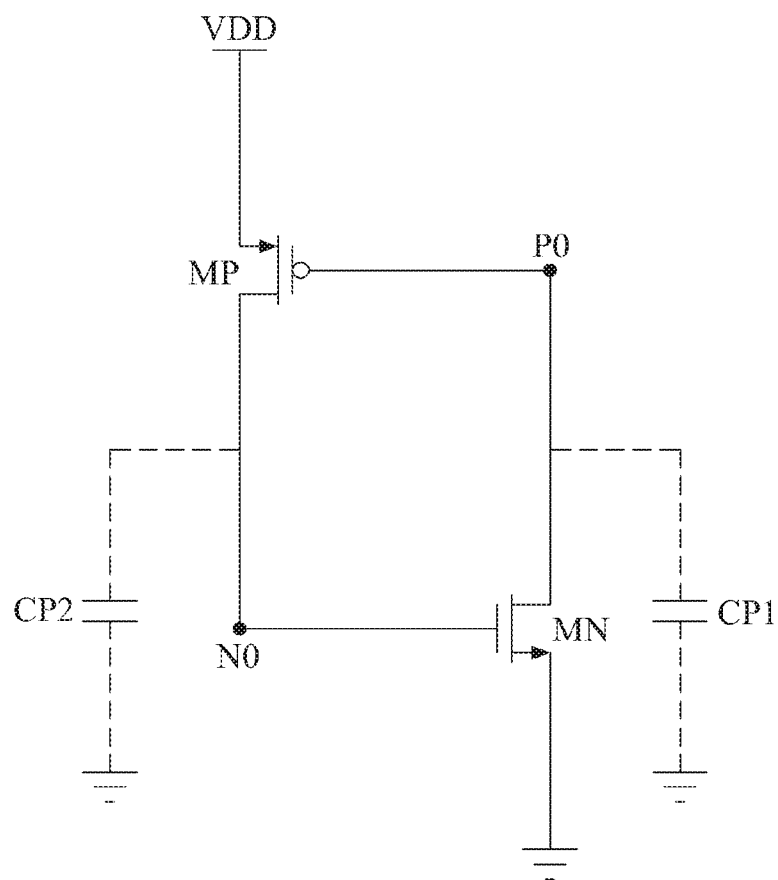
FIG. 2 is a circuit diagram illustrating an example of a transistor circuit included in a delay circuit, according to one or more embodiments.

FIG. 2 is a circuit diagram illustrating an example of a transistor circuit included in a delay circuit, such as the delay circuit of FIG. 1, according to one or more embodiments.

Referring to FIG. 2, a transistor circuit 110 may include a p-type transistor MP, an n-type transistor MN, an n-node NO between a drain node of the p-type transistor MP and a gate node of the n-type transistor MN, a p-node P0 between a gate node of the p-type transistor MP and a drain node of the n-type transistor MN, a parasitic capacitor CP1, and a parasitic capacitor CP2. Each of the p-type transistor MP and the n-type transistor MN may be a metal oxide silicon field effect transistor (MOSFET). The transistor circuit 110 may be a complementary metal oxide silicon (CMOS) thyristor.

A power source voltage VDD may be applied to a source node of the p-type transistor MP. A gate node of the p-type transistor MP may be connected to a drain node of the n-type transistor MN, and a drain node of the p-type transistor MP may be connected to a gate node of the n-type transistor MN. A source node of the n-type transistor MN may be connected to ground.

Figure 3:
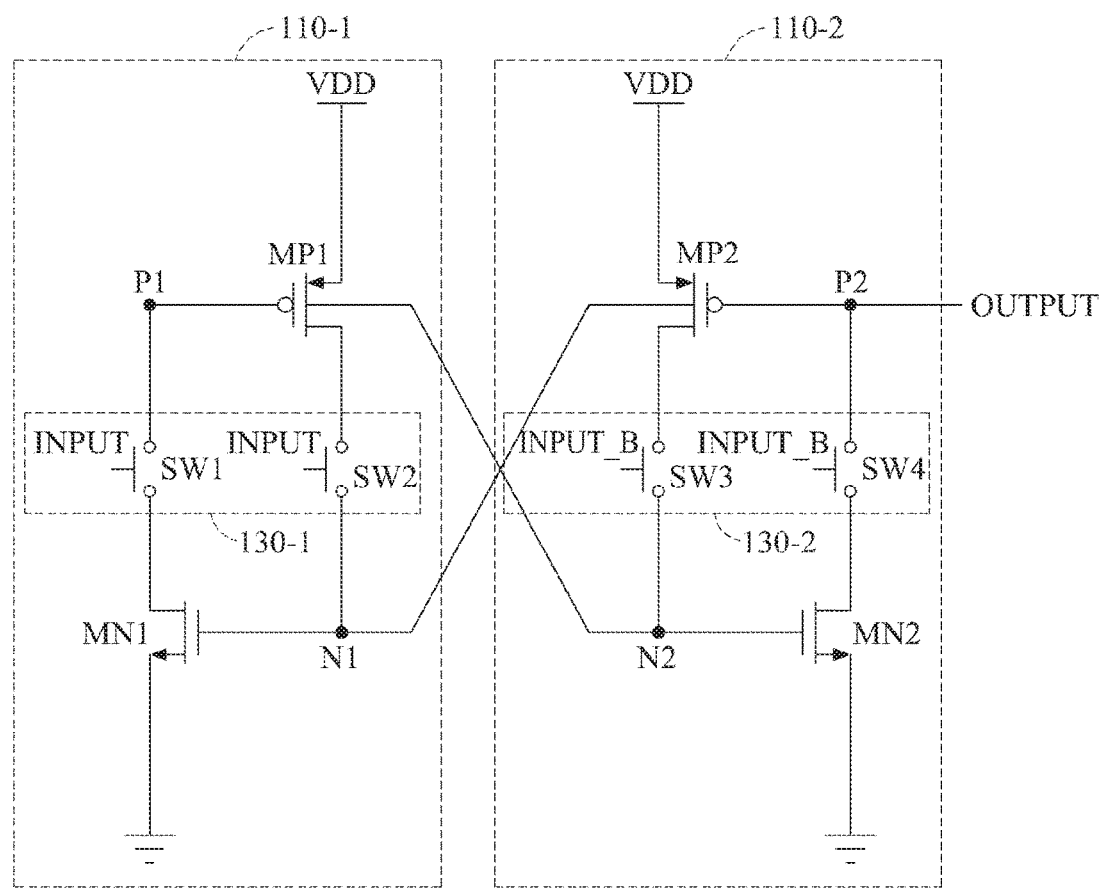
FIG. 3 is a circuit diagram illustrating an example of a delay circuit including a first transistor circuit and a second transistor circuit, according to one or more embodiments.

The p-type transistor MP and the n-type transistor MN may initially be in a turn-off state. For example, the p-node P0 may initially be charged based on the power source voltage VDD and the n-node N0 may initially be discharged based on a ground voltage. As time elapses, the p-node P0 may be discharged through a leakage current of the n-type transistor MN and the n-node N0 may be charged through a leakage current of the p-type transistor MP. When a potential difference between the power source voltage VDD and a voltage of the p-node P0 is greater than a threshold voltage (VTH), the n-type transistor MN may turn on. Concisely, p-node P0 may be discharged through the leakage current and the n-node N0 may be charged based on the power source voltage VDD. When the foregoing operations are alternately performed by two transistor circuits, e.g., such as shown in FIG. 3, a delay signal may be generated. A greater detailed process of generating the delay signal may be provided below with reference to FIGS. 3 through 7.

The delay time of the delay signal may be adjusted based on various factors. For example, the delay time may be adjusted based on one of a capacitance of the parasitic capacitor CP1 and a capacitance of the parasitic capacitor CP2. Based on descriptions that will follow, the delay time may be proportional to the capacitance of the delay circuit 100. That is, the higher the capacitance of the parasitic capacitor CP1 and the parasitic capacitor CP2, the greater the delay time.

Hereinafter, detailed examples of the delay circuit 100 will be described with reference to FIGS. 3 through 6.

FIG. 3 is a circuit diagram illustrating an example of a delay circuit including a first transistor circuit and a second transistor circuit, according to one or more embodiments.

Referring to FIG. 3, a delay circuit 100-1 may include a transistor circuit 110-1 and a transistor circuit 110-2 that are interconnected by switches. The transistor circuit 110-1 may include a switch circuit 130-1 and the transistor circuit 110-2 may include a switch circuit 130-2.

The transistor circuit 110-1 may include a p-type transistor MP1, an n-type transistor MN1, an n-node N1 between a drain node of the p-type transistor MP1 and a gate node of the n-type transistor MN1, and a p-node P1 between a gate node of the p-type transistor MP1 and a drain node of the n-type transistor MN1. The transistor circuit 110-1 may further include parasitic capacitor(s), such as described in FIG. 2.

The transistor circuit 110-1 may generate an output signal OUTPUT corresponding to a delay signal of an input signal INPUT during a first time interval of the input signal INPUT. The switch circuit 130-1 may operate the transistor circuit 110-1 to connect the gate node of the p-type transistor MP1 to the drain node of the n-type transistor MN1 through the p-node P1, and to connect the drain node of the p-type transistor MP1 to the gate node of the n-type transistor MN1 through the n-node N1, during the first time interval based on the input signal INPUT.

The transistor circuit 110-2 may include a p-type transistor MP2, an n-type transistor MN2, an n-node N2 between a drain node of the p-type transistor MP2 and a gate node of the n-type transistor MN2, and a p-node P2 between a gate node of the p-type transistor MP2 and a drain node of the n-type transistor MN2. The transistor circuit 110-2 may include parasitic capacitor(s), such as described in FIG. 2.

The transistor circuit 110-2 may be connected to the transistor circuit 110-1 and generate the output signal OUTPUT during a second time interval of the input signal INPUT. The switch circuit 130-2 may operate the transistor circuit 110-2, e.g., by connecting the gate node of the p-type transistor MP2 to the drain node of the n-type transistor MN2 through the p-node P2, and by connecting the drain node of the p-type transistor MP2 to the gate node of the n-type transistor MN2 through the n-node N2, during the second time interval based on a reverse signal INPUT_B of the input signal INPUT. The transistor circuit 110-1 and the transistor circuit 110-2 may alternately operate based on the respective input signal INPUT and reverse signal INPUT_B. As noted above, and as only an example, the first time interval may occur at the rising edge of the input signal INPUT and the second time interval may occur at the falling edge of the input signal INPUT.

In the transistor circuit 110-1, the n-node N1 may be charged based on a power source voltage through a leakage current of the p-type transistor MP1 during the first time interval of the input signal INPUT. In an example, a parasitic capacitor connected to the n-node N1 may be charged based on the power source voltage. In another example, in the transistor circuit 110-1, the p-node P1 may be discharged based on a ground voltage through a leakage current of the n-type transistor MN1 during the first time interval of the input signal INPUT. In still another example, a parasitic capacitor connected to the p-node P1 may be discharged based on the ground voltage.

The output signal OUTPUT during the first time interval may be a voltage of the n-node N1. For example, when a rising edge of the input signal INPUT is input, a voltage of the n-node N1 may be a ground voltage. Subsequent to a predetermined time delay according to an operation based on a leakage current of the transistor circuit 110-1, a voltage of the n-node N1 may increase to the power source voltage. Concisely, the transistor circuit 110-1 may generate the output signal OUTPUT corresponding to a delay signal of the input signal INPUT, during the first time interval of the input signal INPUT.

In the transistor circuit 110-2, the p-node P2 may be charged based on the power source voltage through the n-node N1 of the transistor circuit 110-1 during the first time interval of the input signal INPUT. In transistor 110-2, the n-node N2 may be discharged based on the ground voltage through the p-node P1 of the transistor circuit 110-1 during the first time interval of the input signal INPUT. Concisely, the transistor circuit 110-1 may provide an initial state of the transistor circuit 110-2.

In the transistor circuit 110-2, the n-node N2 may be charged based on the power source voltage through a leakage current of the p-type transistor MP2 during the second time interval of the input signal INPUT. In an example, the parasitic capacitor connected to the n-node N2 may be charged based on the power source voltage. In another example, the p-node P2 of the transistor circuit 110-2 may be discharged based on the ground voltage through a leakage current of the n-type transistor MN2 during the second time interval of the input signal INPUT.

In still another example, a parasitic capacitor connected to the p-node P2 may be discharged based on the ground voltage.

The output signal OUTPUT during the second time interval may be a voltage of the p-node P2. For example, when a falling edge of the input signal INPUT is input, a voltage of the p-node P2 may be a power source voltage. Subsequent to a predetermined time delay according to an operation based on a leakage current of the transistor circuit 110-2, a voltage of the p-node P2 may increase to the ground voltage. Concisely, the transistor circuit 110-2 may generate the output signal OUTPUT corresponding to a delay signal of the input signal INPUT, during the second time interval of the input signal INPUT.

Hereinafter, adjusting a delay time will be described in greater detail with reference to FIGS. 4 through 6.

Figure 4:
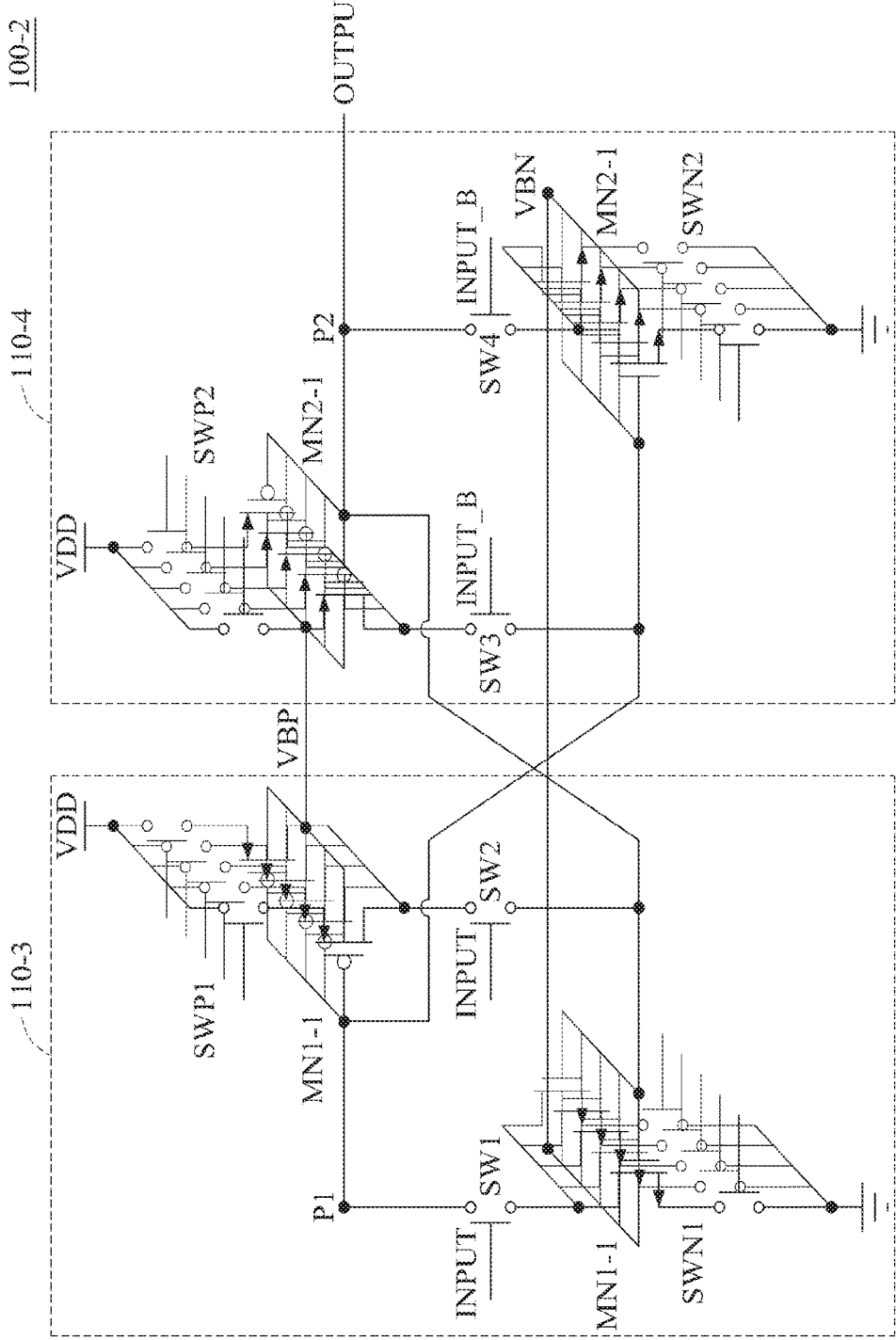
FIG. 4 is a circuit diagram illustrating an example of a delay circuit including a transistor circuit of which a transistor size is adjusted, according to one or more embodiments.

FIG. 4 is a circuit diagram illustrating an example of a delay circuit including a transistor circuit of which a size may be adjusted, according to one or more embodiments.

Referring to FIG. 4, a delay circuit 100-2 may include a transistor circuit 110-3 and a transistor circuit 110-4 that are interconnected by switches.

The transistor circuits 110-3 and 110-4 may include parallel transistors MP1-1, MN1-1, MP2-1, and MN2-1 and switches SWP1, SWP2, SWN1, and SWN2, e.g., in lieu of the transistors MP1, MN1, MP2, and MN2 of the transistor circuits 110-1 and 110-2 described in FIG. 3. The foregoing descriptions of FIG. 3 and descriptions of the parallel transistors MP1-1, MN1-1, MP2-1, and MN2-1 and the switches SWP1, SWP2, SWN1, and SWN2 that will be provided hereinafter are also applicable to the transistor circuits 110-3 and 110-4.

The transistor circuits 110-3 and 110-4 may include transistors of which sizes may be adjusted. For example, the transistor circuits 110-3 and 110-4 may include the parallel transistors MP1-1, MN1-1, MP2-1, and MN2-1 of which sizes are adjusted through the switches SWP1, SWP2, SWN1, and SWN2. The switches SWP1, SWP2, SWN1, and SWN2 may be controlled based on the delay control signal D_CTRL generated by the signal generator 50. The parallel transistors MP1-1, MN1-1, MP2-1, and MN2-1 may adjust a number of transistors connected in parallel based on the delay control signal D_CTRL. When the number of transistors connected in parallel is adjusted, a proportion of a width to a length of a transistor may be changed, e.g., thereby changing respective sizes of the transistors. Since an amount of a leakage current of the transistor is adjusted when the proportion of the width to the length of the transistor is changed, a delay time of the output signal OUTPUT may be adjusted. For example, when the number of transistors connected in parallel increases, an amount of the leakage current may increase and an amount of the delay time may decrease. Alternatively, when the number of transistors connected in parallel decreases, the amount of the leakage current may decrease and the amount of the delay time may increase.

Figure 5:
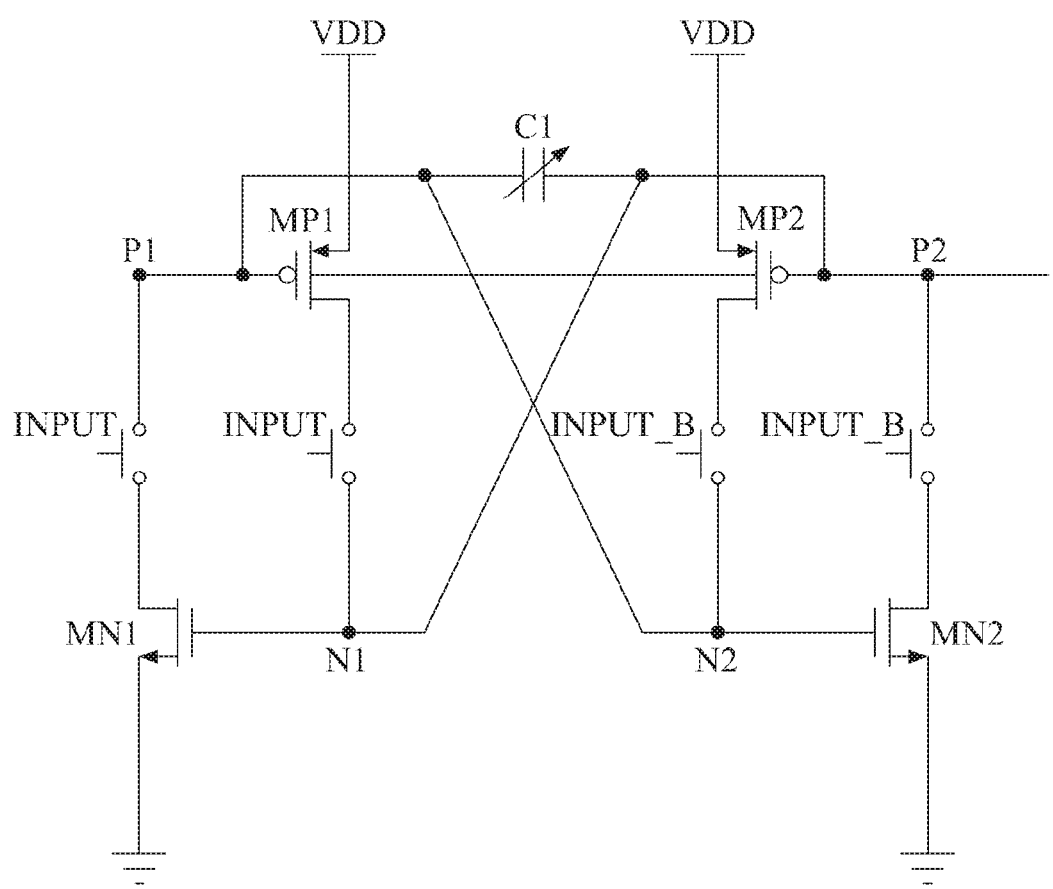
FIG. 5 is a circuit diagram illustrating an example of a transistor circuit including a cross capacitor, according to one or more embodiments.

FIG. 5 is a circuit diagram illustrating an example of a transistor circuit including a cross capacitor, according to one or more embodiments.

Referring to FIG. 5, a delay circuit 100-3 may include a capacitor C1 among transistor circuits that are interconnected by switches. In an example, the capacitor C1 may be a variable capacitor. The descriptions of FIGS. 2 through 4 are also applicable to a description of the delay circuit 100-3, with the exception of the capacitor C1.

In the delay circuit 100-3, a delay time of an output signal OUTPUT may be adjusted by adjusting the capacitance of the capacitor C1. Based on descriptions that will be provided hereinafter, the delay time may be proportional to the adjusted capacitance of the delay circuit 100-3. The delay time may increase correspondingly to an increase in the capacitance of the capacitor C1. The capacitance of the capacitor C1 may be adjusted based on a delay control signal D_CTRL of the signal generator 50.

Figure 6:
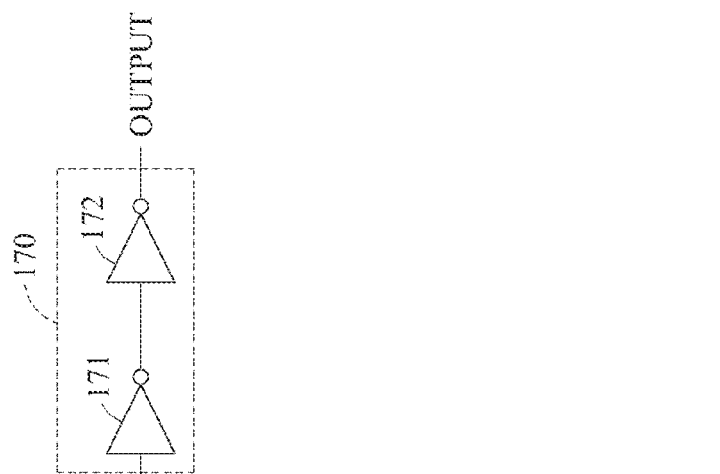
FIG. 6 is a circuit diagram illustrating an example of a transistor circuit including a first inverter and a second inverter, according to one or more embodiments.

FIG. 6 is a circuit diagram illustrating an example of a transistor circuit including a first inverter and a second inverter, according to one or more embodiments.

Referring to FIG. 6, a delay circuit 100-4 may include a transistor circuit 110-5, a transistor circuit 110-6, and an inverter circuit 170. The inverter circuit 170 may include an inverter 171 connected to the transistor circuit 110-6 and an inverter 172 connected to the inverter 171. In a process of delaying the input signal INPUT, a waveform of the input signal INPUT may become distorted because of the leakage current, such as shown in signal VP2 of FIG. 7. The inverter circuit 170 may sharpen the distorted waveform to correspond to the input signal INPUT. The descriptions of FIGS. 2 through 5 are also applicable to the delay circuit 100-4, with the exception of the inverter circuit 170.

Figure 7:
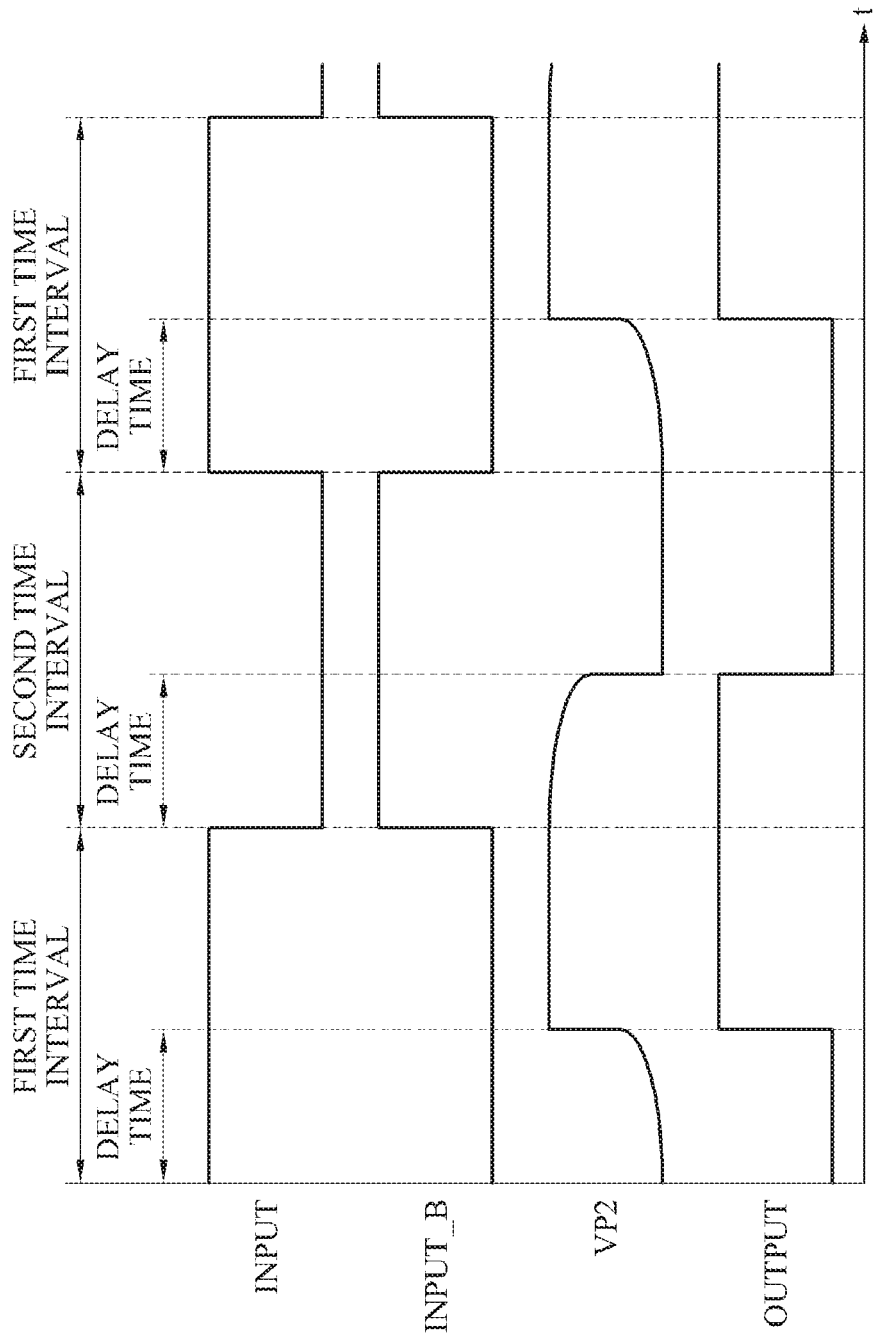
FIG. 7 is a timing chart illustrating an example of a process of generating a delay signal, according to one or more embodiments.

FIG. 7 is a timing chart illustrating an example of a process of generating a delay signal, according to one or more embodiments.

Referring to FIG. 7, voltage values an input signal INPUT, a reverse input signal INPUT_B, a signal VP2, and an output signal OUTPUT are illustrated over time. In an example, as illustrated in FIG. 7, a first time interval may be an interval from a rising edge of the input signal INPUT to a falling edge and a second time interval may be an interval from a falling edge of the input signal INPUT to a rising edge.

The signal VP2 and the output signal OUTPUT may be respective signals measured at the p-node P2 and OUTPUT in FIG. 6, for example. A change rate of the illustrated curved portion of the signal VP2 may be expressed as shown below in Equation 1, for example.

$$\frac{dV}{dt} = \frac{I_{Leakage}}{C_{Cross}} \approx \frac{V_{th}}{t_{Delay}} \qquad \text{Equation 1}$$

In Equation 1, $I_{Leakage}$ denotes a leakage current, $C_{Cross}$ denotes a capacitance of a cross capacitor, $V_{th}$ denotes a threshold voltage, and $t_{Delay}$ denotes a delay time. Here, as discussed above and only as an example, $t_{Delay}$ may be controlled by the CTRL or D_CTRL signals discussed above with regard to FIG. 1, for example. The capacitance of the cross capacitor may correspond to the capacitances of the capacitors CP1 and CP2 illustrated in FIG. 2, for example, and the capacitance of the capacitor C1 illustrated in FIG. 5, for example. Based on Equation 1, the delay time may be in proportion to the threshold voltage and the capacitance of the cross capacitor and in reverse proportion to the leakage current. The leakage current may be adjusted based on a controlled size of the transistor(s) and the threshold voltage may be adjusted based on body voltages of the transistor(s). The delay time may be adjusted based on one of the size of the transistor(s), the body voltage(s) of the transistor(s), and the capacitance of the example cross capacitor. The delay circuit 100 and the signal generator 50 may, thus, adjust the delay time of the output signal OUTPUT by adjusting one of the size of the transistor, the body voltage of the transistor, and the capacitance of the cross capacitor.

Figure 8:
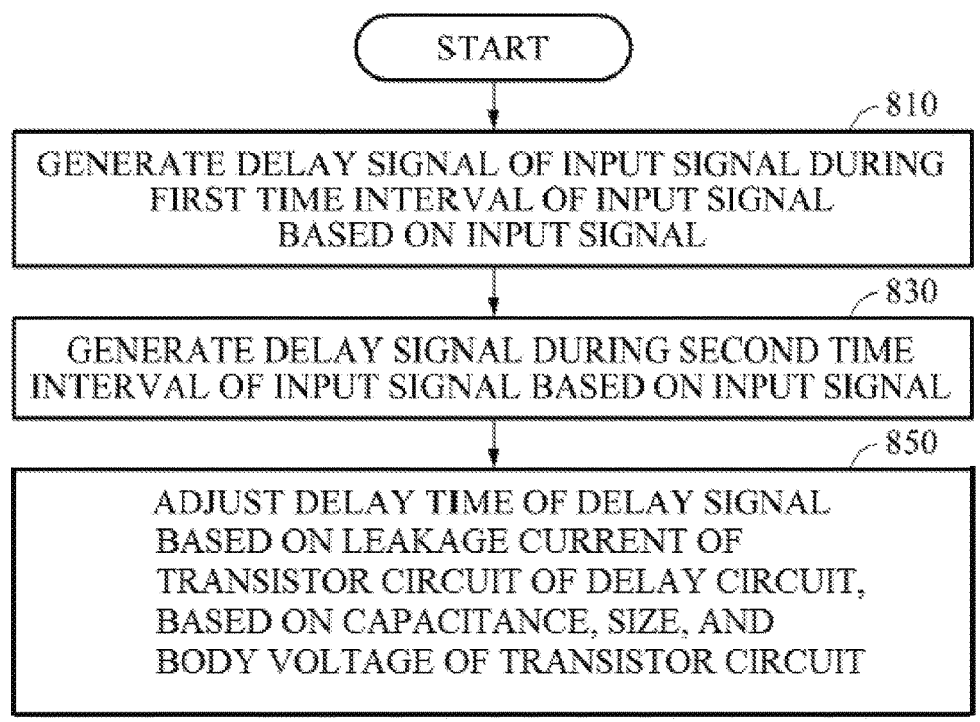
FIG. 8 is a flowchart illustrating an example of a method of operating a delay circuit, according to one or more embodiments.

FIG. 8 is a flowchart illustrating an example of a method of operating a delay circuit, according to one or more embodiments. As only examples, the delay circuit 100 will be discussed as implementing operations 810, 830, and 850 of FIG. 8, noting that the described operations are not limited to the same.

Referring to FIG. 8, in operation 810, the delay circuit 100 may generate a delay signal of an input signal INPUT during a first time interval of the input signal INPUT based on the input signal INPUT.

In operation 830, the delay circuit 100 may generate a delay signal during a second time interval of the input signal INPUT based on the input signal INPUT.

In operation 850, the delay circuit 100 may adjust a delay time of the delay signal, as desired.

The operation of the delay circuit 100 is also applicable to operations 810 through 850, and the operations 810 through 850 are equally further applicable to any of the delay circuits of FIGS. 2-6. In addition, one or more embodiments further include methods represented by operations performed by any of the arrangements of FIGS. 1-6 and represented by the graph of FIG. 7.

In addition to the elements of the delay circuits of FIGS. 1-6 being hardware elements, the method of FIG. 8 may be implemented by hardware components, including one or more processing devices, or processors, or computers, and the delay circuits of FIGS. 1-6 may similarly be included in an electronic device as hardware components. A processing device, processor, or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer execute instructions or software, such as an operating system (OS) and one or more software applications that run on the OS, to perform or control the operations described herein with respect to FIG. 8, for example. The hardware components also access, manipulate, process, create, and store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 8 that perform the operations described herein may be performed or controlled by a processing device, processor, or a computer as described above executing instructions or software to perform the operations described herein.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processing device, processor, or computer to implement the hardware components, such as discussed in any of FIGS. 1-6 and perform the method as described above in FIG. 8, including controlling of the generation of the delay control signal based on any resultant delayed output signal or selective choosing of an appropriate delay control signal for desired asynchronous operation, and any associated data, data files, and data structures, are recorded, stored, or fixed in or on one or more non-transitory computer-readable storage media. Examples of a non-transitory computer-readable storage medium include read-only memory (ROM), random-access memory (RAM), dynamic random-access memory (D-RAM), static random-access memory (S-DRAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

As a non-exhaustive example only, and in addition to the above explanation of potential hardware implementations of the electronic device, an electronic device embodiment herein, such as electronic device 10 of FIG. 1 as only an example, that includes such a delay circuit, as described herein, may also be a mobile device, such as a cellular phone, a smart phone, a wearable smart or bio-signal device, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a television or display, a DVD player, a Blu-ray player, a set-top box, or a home appliance, an Internet of Things device, or any other mobile or stationary device, e.g., capable of wireless or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. A delay circuit, comprising:
   a first transistor circuit configured to
      receive an input signal, and
      generate a first signal, as a delayed signal of the input signal, during a first time interval of the input signal; and
   a second transistor circuit connected to the first transistor circuit, and configured to
      receive a reverse signal of the input signal, and
      generate a second signal, as the delayed signal of the input signal, during a second time interval of the input signal,
   wherein the first transistor circuit and the second transistor circuit are controlled to alternately operate to respectively generate the first signal and the second signal, based on respective occurrences of the first and second time intervals of the input signal.

2. The delay circuit of claim 1, wherein
   the occurrence of the first time interval is initiated by, or includes, a rising edge of the input signal, and
   the occurrence of the second time interval is initiated by, or includes, a falling edge of the input signal.

3. The delay circuit of claim 1, wherein
   the first transistor circuit comprises a first switch circuit configured to operate the first transistor circuit, based on the input signal, during the first time interval, and
   the second transistor circuit comprises a second switch circuit configured to operate the second transistor circuit, based on the reverse signal, during the second time interval.

4. The delay circuit of claim 3, wherein
   the first transistor circuit comprises the first switch circuit configured to not operate the first transistor circuit during the second time interval, and
   the second transistor circuit comprises the second switch circuit configured to not operate the second transistor circuit during the first time interval.

5. The delay circuit of claim 1, wherein the first transistor circuit comprises:
   a first p-type transistor;
   a first n-type transistor;
   a first n-node disposed between a drain node of the first p-type transistor and a gate node of the first n-type transistor; and
   a first p-node disposed between a gate node of the first p-type transistor and a drain node of the first n-type transistor.

6. The delay circuit of claim 5, wherein
   the first n-node is charged based on a power source voltage through a leakage current of the first p-type transistor during the first time interval, and
   the first p-node is discharged based on a ground voltage through a leakage current of the first n-type transistor during the first time interval.

7. The delay circuit of claim 5, wherein the second transistor circuit comprises:
   a second p-node configured to be charged based on a power source voltage through the first n-node of the first transistor circuit during the first time interval; and
   a second n-node configured to be discharged based on a ground voltage through the first p-node of the first transistor circuit during the first time interval.

8. The delay circuit of claim 1, further comprising:
   a capacitor connected between the first transistor circuit and the second transistor circuit,
   wherein a delay time of the delayed signal of the input signal is adjusted based on a controlled adjusting of a capacitance of the capacitor.

9. The delay circuit of claim 1, wherein
   the first transistor circuit comprises a first variable transistor configured to have a size that is selectively adjusted based on a delay control signal, so that a leakage current of the first transistor circuit is adjusted based on the selectively adjusted size of the first variable transistor.

10. The delay circuit of claim 1, wherein
    the first transistor circuit comprises a parallel transistor circuit configured to have a number of transistors connected in parallel to be selectively adjusted based on a delay control signal, so that a leakage current of the first transistor circuit is adjusted based on the selectively adjusted number of transistors connected in parallel.

11. The delay circuit of claim 1, wherein a leakage current of the first transistor circuit is adjusted based on selectively controlled body voltage of the first transistor circuit.

12. The delay circuit of claim 1, wherein a leakage current of the first transistor circuit is adjusted based on a parasitic capacitance of the first transistor circuit.

13. The delay circuit of claim 1, further comprising:
    a first inverter connected to the second transistor circuit to invert the delayed signal of the input signal, and
    a second inverter connected to the first inverter, to output a corrected delayed signal of the input signal, from an output of the first inverter, so as to reduce smoothing caused by leakage currents.

14. An electronic device comprising:
    a delay circuit comprising
       a first transistor circuit configured to generate a first signal, as a delayed signal of an input signal, during a first time interval of the input signal, and a second transistor circuit connected to the first transistor circuit, and configured to receive a reverse signal of the input signal, and generate a second signal, as the delayed signal of the input signal, during a second time interval of the input signal; and
a signal generator configured to selectively operate, based on the input signal, the first transistor circuit during the first time interval, and the second transistor circuit during the second time interval.

15. The electronic device of claim 14, wherein the signal generator is configured to operate the second transistor circuit, during the second time interval, based on the reverse signal of the input signal.

16. The electronic device of claim 14, wherein the signal generator is configured to adjust a delay time of the delayed signal of the input signal, by selectively adjusting respective leakage currents of the first transistor circuit and the second transistor circuit, based on a delay control signal.

17. The electronic device of claim 14,
wherein the delay circuit comprises a variable capacitor connected between the first transistor circuit and the second transistor circuit, and
wherein the signal generator is configured to adjust a delay time of the delayed signal of the input signal, by selectively adjusting a capacitance of the variable capacitor, based on a delay control signal.

18. The electronic device of claim 14, wherein the signal generator is configured to adjust a delay time of the delayed signal of the input signal by adjusting, based on a delay control signal, one of a first parasitic capacitance of the first transistor circuit and a second parasitic capacitance of the second transistor circuit.

19. The electronic device of claim 14,
wherein the first transistor circuit comprises a first variable transistor configured to have a size that is selectively adjusted, and
wherein the signal generator is configured to adjust a delay time of the delayed signal of the input signal, by selectively adjusting the size of the first variable transistor, based on a delay control signal.

20. The electronic device of claim 14,
wherein the first transistor circuit comprises a first parallel transistor circuit configured to have a number of transistors connected in parallel that is selectively adjusted based on a delay control signal, and
wherein the signal generator is configured to selectively adjust a delay time of the delayed signal of the input signal by adjusting the number of transistors connected in parallel based on the delay control signal.

21. A delay circuit operation method, comprising:
generating a first signal, as a delayed signal of an input signal, using the input signal during a first time interval of the input signal;
generating a second signal, as the delayed signal of the input signal, using a reverse signal of the input signal during a second time interval of the input signal, based on the input signal; and
controlling an adjustment of a delay of the delayed signal of the input signal, based on a delay control signal.

22. An electronic device, comprising:
a first transistor circuit configured to
receive an input signal, and
selectively generate a first signal from the input signal during a first time interval of the input signal; and
a second transistor circuit connected to the first transistor circuit, and configured to
output the first signal, as a delay of the input signal, during the first time interval and while the second transistor circuit is controlled to not operate, and
receive a reverse signal of the input signal, and
output a second signal, as the delay of the input signal, during a second time interval of the input signal and while the second transistor circuit is controlled to operate.

23. The electronic device of claim 22, wherein the first and second transistor circuits are configured so that a delay difference, between the input signal and a combination of the output first signal and output second signal, is adjustable based upon a delay control signal.

* * * * *